United States Patent [19]

Kilmer et al.

[11] Patent Number: 5,497,297
[45] Date of Patent: Mar. 5, 1996

[54] FRAME AND COVER STRUCTURE FOR INTEGRATED CIRCUIT CARDS

[75] Inventors: Callen S. Kilmer, Roseville; James R. Baehne, Placerville, both of Calif.

[73] Assignee: Intel Corporation, Santa Clara, Calif.

[21] Appl. No.: 267,459

[22] Filed: Jun. 28, 1994

[51] Int. Cl.⁶ ...................................................... H05K 1/14
[52] U.S. Cl. ........................... 361/737; 361/758; 361/801; 235/492; 439/74
[58] Field of Search ...................................... 361/737, 740, 361/742, 752, 758, 759, 796, 801; 235/441, 486, 487, 492; 206/328–331; 439/44, 74; 365/52

[56] References Cited

U.S. PATENT DOCUMENTS

| | | | |
|---|---|---|---|
| 5,038,250 | 8/1991 | Uenaka et al. | 361/395 |
| 5,333,100 | 7/1994 | Anhalt et al. | 361/818 |

*Primary Examiner*—Leo P. Picard
*Assistant Examiner*—Y. Whang
*Attorney, Agent, or Firm*—Blakely, Sokoloff, Taylor & Zafman

[57] ABSTRACT

An apparatus for receiving and holding a printed circuit board. The apparatus includes a cover having a bottom surface upon which an adhesive is deposited. The apparatus also includes a frame coupled to the cover for receiving the printed circuit board. The frame has a bonding surface that includes a plurality of adhesive thickness control bumps. Each of the plurality of adhesive thickness control bumps is of a predefined height such that the bondline thickness of the adhesive is limited when the bottom surface of the cover is bonded to the frame. For a second embodiment, the cover further includes a plurality of feet extending from the bottom surface of the cover, and the frame further includes a plurality of slots for receiving the plurality of feet. Each of the plurality of slots includes a lip and each of the plurality of feet has a latch tab formed therein such that positioning the feet in the slots causes the latch tabs to catch the lips of the slots such that the cover is locked to the frame. For a third embodiment, the frame further includes an open end for receiving a connector. The open end includes connector clasps for receiving connector tabs such that the connector is locked into place when the connector tabs are placed in the connector clasps.

36 Claims, 8 Drawing Sheets

FIG_3A

FIG_5A

FIG_5B

FIG_5C

FIG_6A

FIG_6B

FRAME AND COVER STRUCTURE FOR INTEGRATED CIRCUIT CARDS

FIELD OF THE INVENTION

The present invention relates to the field of integrated circuit cards; particularly, the present invention relates to an apparatus for receiving and holding a printed circuit board.

BACKGROUND OF THE INVENTION

An international standard which defines the physical and electrical interface specifications for the interchangeability of memory and input/output cards was introduced by Personal Computer Memory Card International Association (PCMCIA) jointly with the Japanese Electrical Industry Association (JEIDA) in September of 1991. In addition, a specification referred to as an Exchangeable Card Architecture (ExCA) specification, Dec. 20, 1991, has been issued by Intel Corporation of Santa Clara, Calif. The ExCA document describes specifications which manufacturers may use to provide interfaces which are ensured of allowing the memory and input/output cards for portable personal computers of different manufacturers to be interchanged.

A socket design to these specifications allows integrated circuit (IC) cards, such as modem and memory cards, to be attached, used, and removed interchangeably in the same socket. Computer systems typically include at least one socket recessed within the computer, such that the inserted components (e.g., modem, LAN, etc.) are protected by the body of the computer surrounding the interface circuitry (i.e., socket) in which the components are to be coupled.

The PCMCIA standard includes a maximum warpage specification which requires that the physical structure of IC cards must undergo and pass a number of stringent mechanical tests. First, the IC card must pass a shock and vibration test in which the IC card is subjected to shock and vibration to determine if the integrity of the physical structure of the IC card is violated. Second, the IC card is subjected to a bend test in which a first end of the IC card is clamped such that most of the IC card is suspended above a surface. A static load is then placed at the opposite end to determine the extent to which the static load will warp the physical structure of the IC card. Currently, the static load is equal to 4.4 pounds. A third test is the torque test in which the IC card is again clamped as described for the bend test. Torque is applied to the unclamped end such that the IC card is twisted. Currently, the maximum torque is 12.6 kg-cm and the maximum angel of twisting is ten degrees. The torque test is also used to determine the amount of warp.

Typical prior art IC cards have been unable to meet the maximum warpage specification of the PCMCIA standard. This inability to meet the warpage specification results in many types of failures including printed circuit board damage due to flex, frame breakage, the separation or lifting of the cover from the frame, cover deformation, and connector misalignment and movement. A new frame and cover structure for IC cards is therefore needed to better meet the maximum warpage specification of the PCMCIA standard.

SUMMARY OF THE INVENTION

Therefore, one object of the invention to increase the rigidity of the IC card.

Another object of the invention is to provide an integrated circuit card that meets the maximum warpage specification of revision 2.0 of the PCMCIA standard.

These and other objects of the invention are provided by an apparatus for receiving and holding a printed circuit board. The apparatus includes a cover having a bottom surface upon which an adhesive is deposited. The apparatus also includes a frame coupled to the cover for receiving the printed circuit board. The frame has a bonding surface that includes a plurality of adhesive thickness control bumps. Each of the plurality of adhesive thickness control bumps is of a predefined height such that the bondline thickness of the adhesive is limited when the bottom surface of the cover is bonded to the frame. For a second embodiment, the cover further includes a plurality of feet extending from the bottom surface of the cover, and the frame further includes a plurality of slots for receiving the plurality of feet. Each of the plurality of slots includes a lip and each of the plurality of feet has a latch tab formed therein such that positioning the feet in the slots causes the latch tabs to catch the lips of the slots such that the cover is locked to the frame. For a third embodiment, the frame further includes an open end for receiving a connector. The open end includes connector clasps for receiving connector tabs such that the connector is locked into place when the connector tabs are placed in the connector clasps.

BRIEF DESCRIPTION OF THE DRAWINGS

The present invention will be understood more fully from the detailed description given below and from the accompanied drawings of the preferred embodiments of the invention, which, however, should not be taken to limit the invention to the specific embodiments, but are for explanation and understanding only.

DETAILED DESCRIPTION

An apparatus for receiving and holding a printed circuit board is disclosed. To facilitate understanding of the claimed invention, examples including numerous details are provided. It will be apparent to one skilled in the art that the present invention may be practiced without these specific details. In other instances, well-known structures and devices are shown in block diagram form, rather than in detail, in order to avoid unnecessarily obscuring the present invention.

Figure 1:
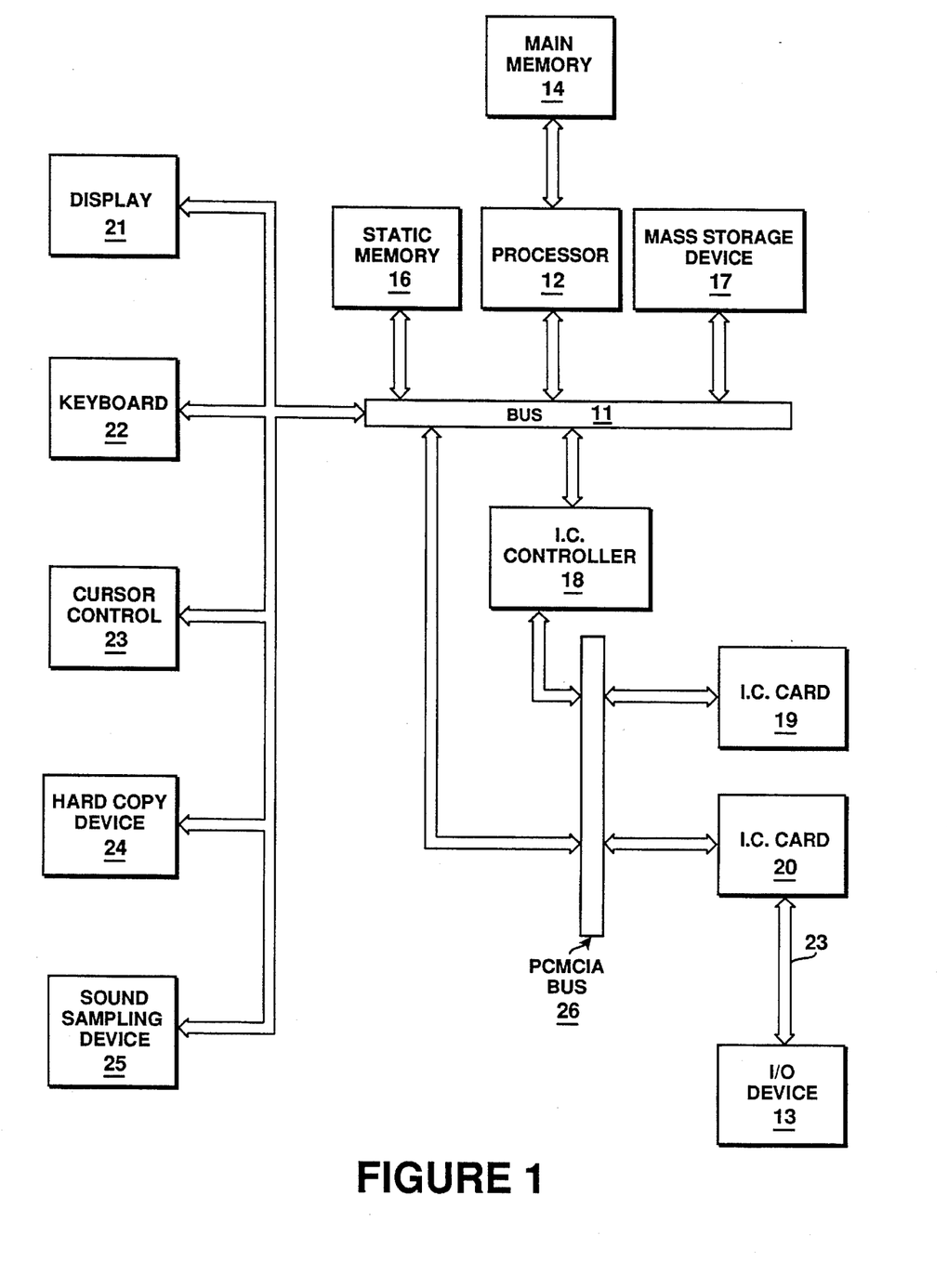
FIG. 1 is a block diagram of a computer system of one embodiment.

FIG. 1 shows a computer system of one embodiment. The computer system generally comprises a bus 11, a processor 12, main memory 14, non-volatile or static memory 16, and mass storage device 17. Typically, the mass storage device 17 is a magnetic hard disk drive, but for certain implementations the mass storage device 17 may be an IC card that acts as a solid state hard drive that emulates a magnetic hard disk drive. For example, wherein the computer system is a personal digital assistant (PDA), or pen-based computer, the reduced size of a solid state hard drive is desirable. The computer system may also include display 21, keyboard 22, cursor control 23, hard copy device 24, and sound sampling device 25.

Integrated circuit cards 19 and 20 are included in the computer system and are coupled to PCMCIA bus 26. Note that although the computer system only shows two IC cards, the number of IC cards which may be coupled to the computer system may vary. For the present embodiment, IC cards 19 and 20 are PCMCIA cards. PCMCIA bus 26 is coupled to bus 11 and to integrated circuit (IC) controller 18 for providing communication information between cards 19 and 20 and the remainder of the computer system. PCMCIA bus 26 is a standard PCMCIA bus for communicating information according to the PCMCIA standard. Note that although IC cards 19 and 20 and PCMCIA bus 26 communicate according to the PCMCIA standard, other interface types and configurations may be used. IC controller 18 provides control and address information to IC cards 19 and 20 via PCMCIA bus 26 and is coupled to bus 11. Also note that although the cards are shown coupled to PCMCIA bus 26, the cards are not coupled to PCMCIA bus 26 until they are inserted into slots in the side of the computer, such that their standard interface (e.g., 68 pin PCMCIA standard interface) is mated with the interface pins (e.g., the 68 pins) within the computer system.

The IC cards 19 and 20 are of particular use in portable computer systems such as PDAs and laptop computers where a premium is placed on a small size and low power requirements. As described below, the IC cards are capable of providing a number of different functions, and the interchangeability of IC cards allows the user to conveniently reconfigure the portable computer system.

Finally, the computer system includes input/output (I/O) device 13 for providing an input/output port or connector for the computer system. I/O device 13 is coupled to signal path/bus 31 for access to signals from IC card 20. In another embodiment, I/O device 13 could also be coupled to bus 11 for communication with the remainder of the computer system. In one embodiment, I/O device 13 comprises a jack or plug, such as an RJ11 jack, RJ45 jack or other proprietary or telephone port that is coupled to the PC chassis for input and output. I/O device 13 can also include an infrared antennae or a radio-frequency antennae or other communications device. Note that although only one I/O device is shown, the computer system of the present invention may include multiple I/O devices and multiple I/O device may be coupled to an IC card.

A computer system for a particular embodiment may not require or include all of the above components. For example, for certain implementations a keyboard and cursor control device for inputting information to the system may not be required. For other implementations, a display device is not necessary. Also, some components may be coupled in other configurations. For instance, main memory 14 may be coupled directly to bus 11 instead of being coupled to processor 12 directly.

Figure 2A:
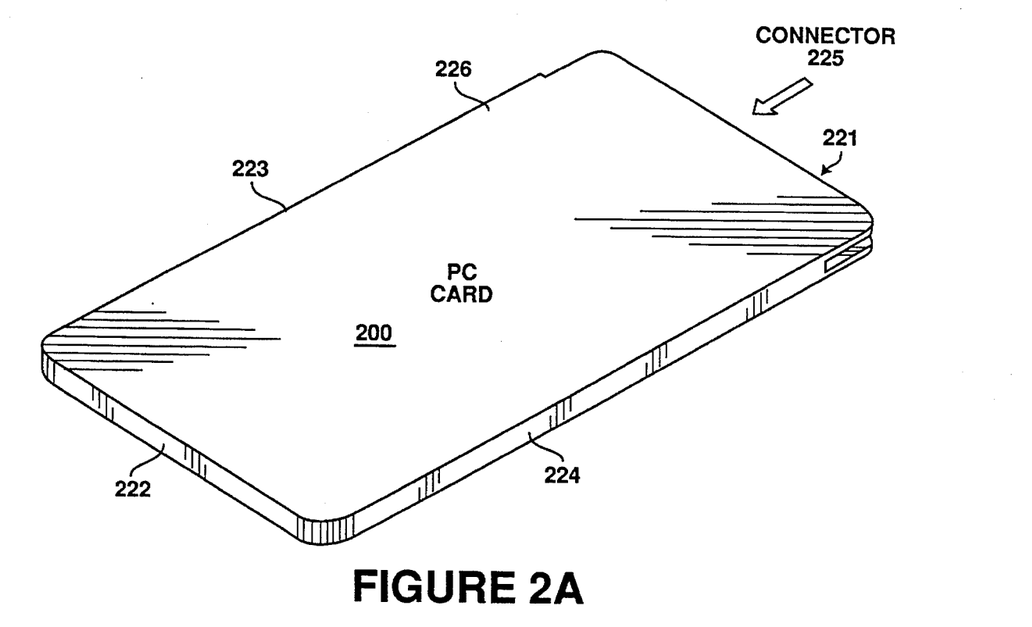
FIG. 2A shows an IC card having a frame and cover structure according to one embodiment.
Figure 2B:
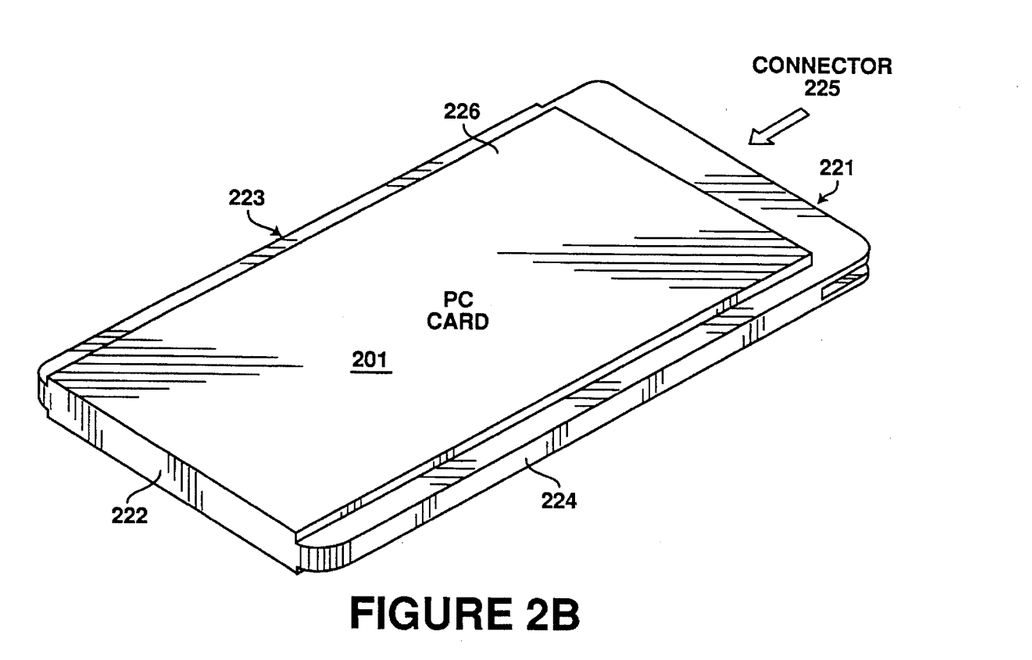
FIG. 2B shows an IC card having a frame and cover structure according to one embodiment.

FIGS. 2A and 2B illustrate two embodiments of integrated circuit cards having increased rigidity. FIG. 2A illustrates IC card 200 which is a Type 1 IC card according to the PCMCIA PC card 2.0 standard. FIG. 2B illustrates IC card 201 which is a Type 2 IC card according to the PCMCIA PC card 2.0 standard. Integrated circuit cards adhering to the PCMCIA standard are often referred to as PC cards. Of course, the specific PC card standard or specification implemented is relevant to the frame and cover structure described below only to the extent that the PC card standard or specification dictates the dimensions and the mechanical and structural requirements of the PC card. The apparatus described may thus be used with any PC card standard or specification requiring some amount of rigidity for the PC card.

Each IC card includes a frame 230 which has front and back ends 221 and 222, respectively, and opposite sides 223 and 224. Connector 225 is mounted at the front end of the frame 230 and has multiple pin sockets for coupling the IC card to the computer system. Connector 225 has 68 sockets such that when either of IC cards 200 and 201 is inserted into the slot of the computer, each of the sockets in connector 225 mates with one of 68 pins to provide an electrical connection. Connector 225 constitutes the standard interface of the IC card. Connector 225 requests the PCMCIA standard 68 pin interface connector. Primary and secondary covers 226 are attached to the frame 230 to completely enclose the circuit board assembly, leaving the connector 225 as an electrical interface with the PCMCIA bus.

Within each of IC cards 200 and 201 is a circuit board assembly (not shown) which includes a circuit board upon which multiple circuit components are mounted. The circuit board assembly is mounted to the frame 230. The circuit board, in conjunction with the circuit components, provides a designated function to the computer system. In other words, each of the IC cards provides an architecture for performing a designated function for the computer system. For example, a local area network IC card for connecting the computer system to a local area network includes circuit components designed to provide the protocol and handshaking necessary to achieve the LAN hook-up. In other embodiments, a particular IC card could act as a modem or a facsimile device. Note that for other embodiments, IC cards 200 and 201 could provide a variety of input/output functions. For instance, IC card 200 or 201 could provide for radio frequency or infrared communications.

Figure 3A:
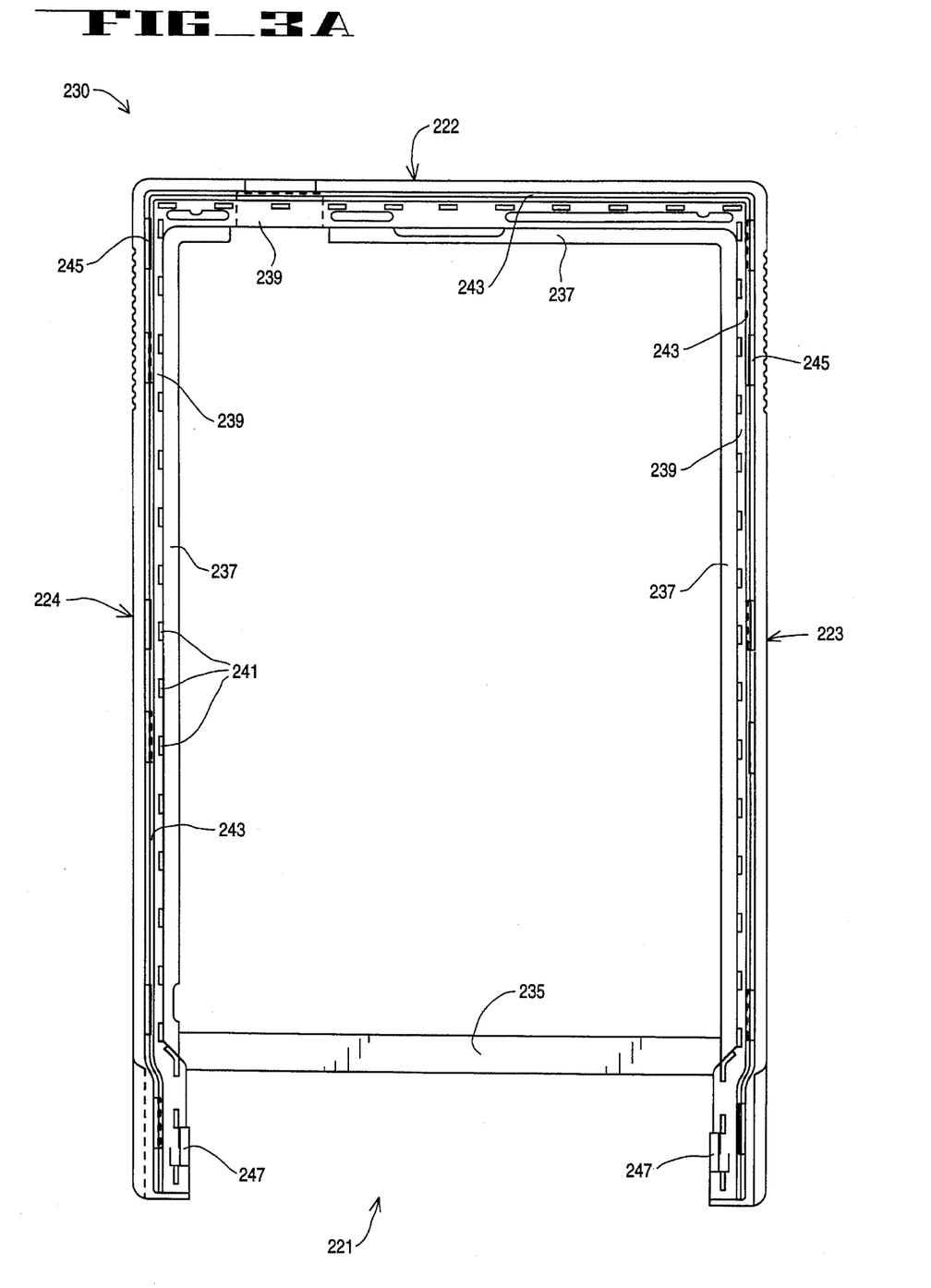
FIG. 3A shows the primary side of the frame of the IC card.
Figure 3B:
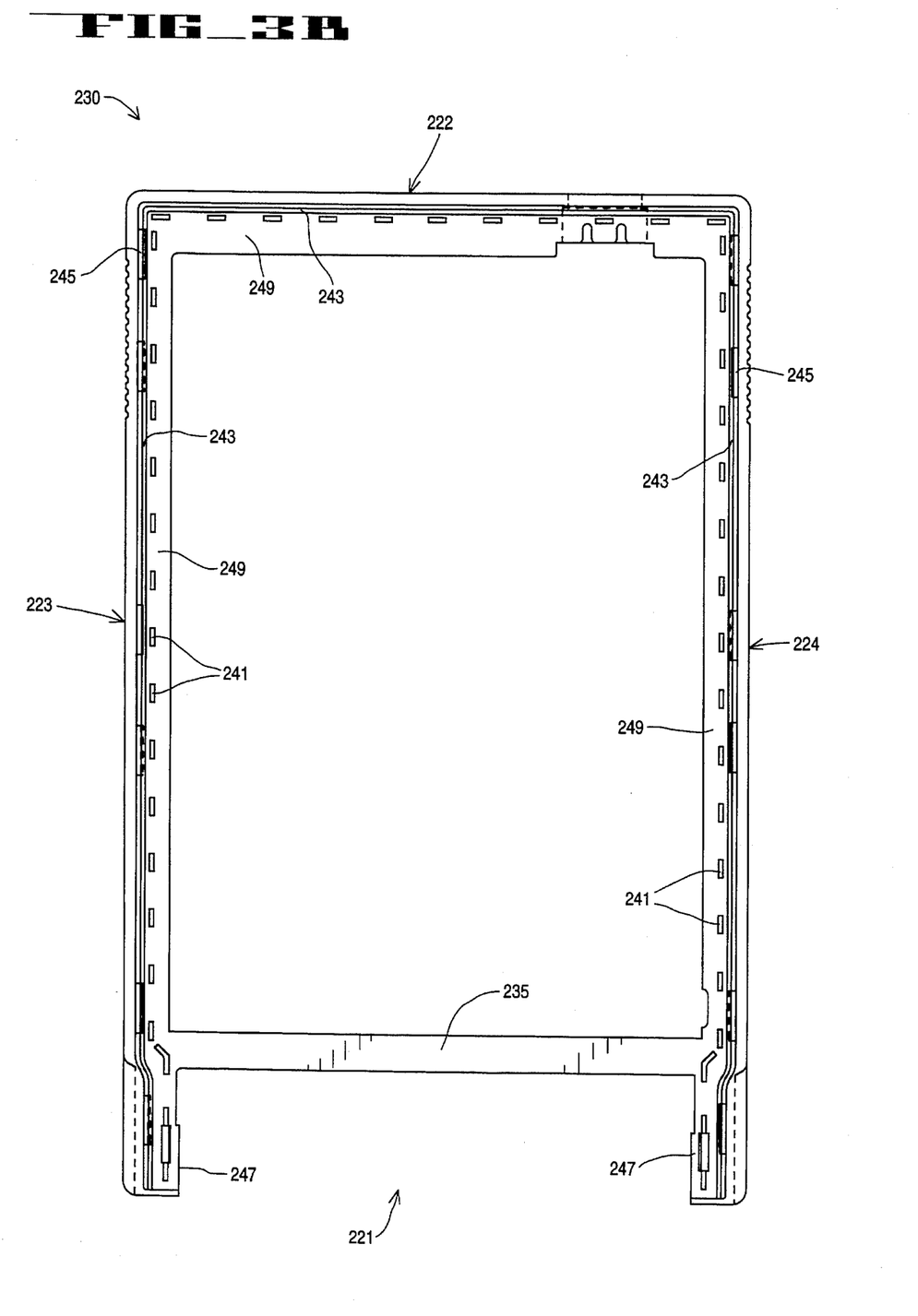
FIG. 3B shows the secondary side of the frame of the IC card.

FIGS. 3A and 3B show the frame of the IC card in greater detail. FIG. 3A is a view of the primary side of frame 230, which includes opposite sides 223 and 224, back end 222, and an open front end 221 for receiving connector 225. The open front end 221 is defined on three sides by an extending portion of side 223, an extending portion of side 224 and a crossbar 235 that is connected between side 223 and side 224. Frame 230 also includes an inner ledge 237 upon which the circuit board is rested. When in place, the printed circuit board is recessed within the frame 230 such that attachment of the primary and secondary covers 226 completely encloses and protects the components of the printed circuit board.

The primary side of frame 230 includes a primary bonding surface 239 within which adhesive thickness control bumps 241 are formed. A retaining rim 243 bounds the outer edge of the primary bonding surface 239. As described below, the adhesive thickness control bumps 241 and the retaining rim 243 help to increase the rigidity of the IC card.

The primary side of frame 230 also includes slots 245. There are six slots 245 in each of the opposite sides 223 and 224. The slots 245 are part of a cover-to-frame lock structure for locking the covers 226 of the IC card to the frame 230. The cover-to-frame lock structure also assists in increasing the rigidity of the IC card.

FIG. 3B shows the secondary side of frame 230, which includes secondary bonding surface 249 for bonding secondary cover 226 to the frame 230. Secondary bonding surface 249 is bounded by a retaining rim 243 and includes adhesive thickness control bumps 241. The slots 245 extend through the opposite sides 223 and 224 of the frame 230 to receive the feet of the secondary cover 226. Three of the slots 245 in each of the opposite sides 223 and 224 are for receiving the feet of the primary cover, wherein the remaining three slots of the same side are for receiving the feet of the secondary cover.

Figures 7, 8:
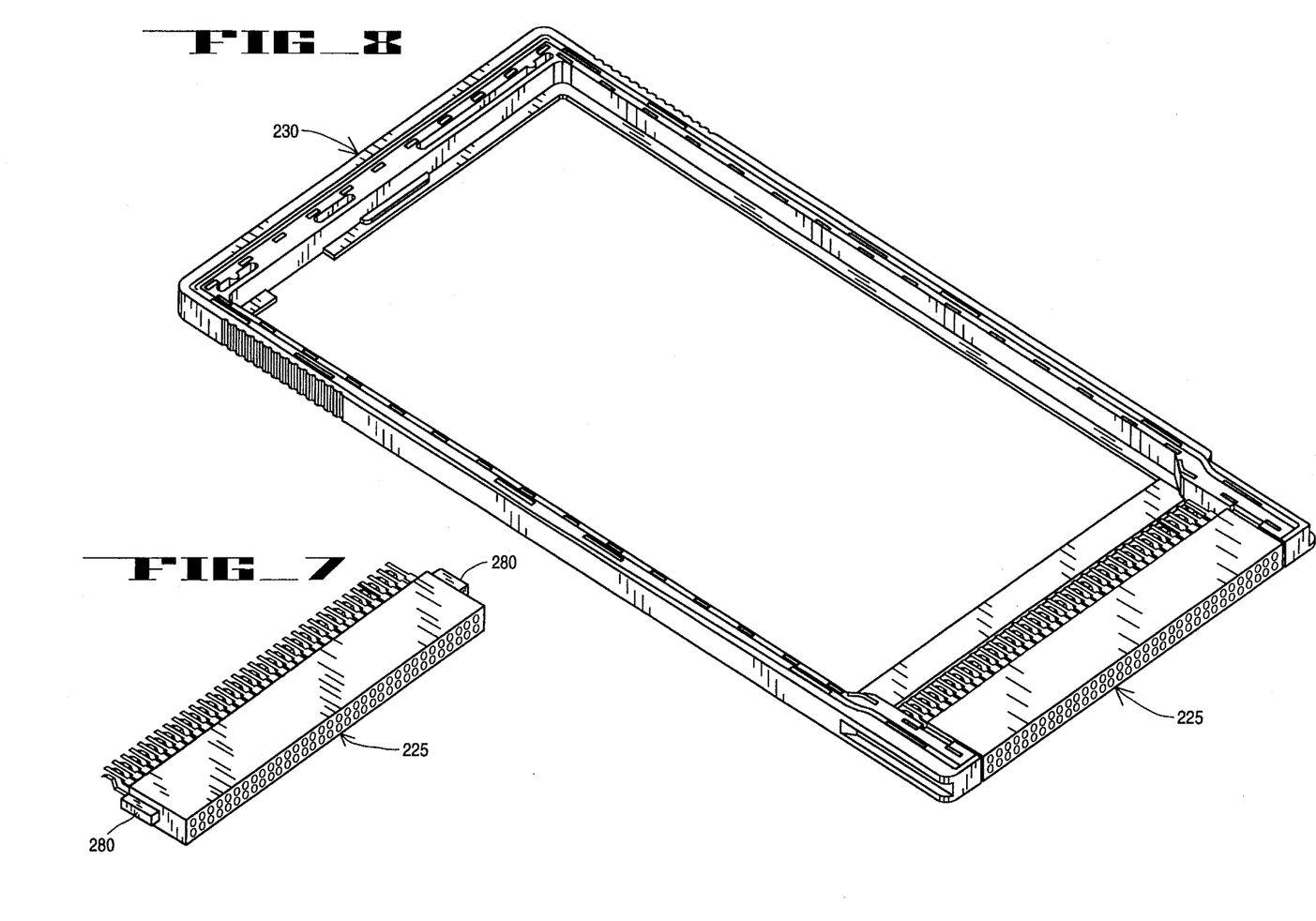
FIG. 7 shows the connector of the IC card.
FIG. 8 is an isometric view showing the connector being received in the frame of the IC card.

Frame 230 also includes connector clasps 247 in the open end 221 for receiving connector tabs 280 of connector 225 (FIG. 7). When the connector 225 is in place in the open front end 221, the connector clasps 247 surround the connector tabs 280 of the connector 225, locking it in place. Because the connector 225 is locked into the frame 230, the mechanical strength of the IC card is increased. The connector 225 is discussed in greater detail below.

Returning to FIG. 3A, the primary bonding surface 239 provides a bonding surface area for bonding the primary cover 226 to the primary side of frame 230. The connector 225 (FIG. 8) provides additional bonding surface area when it is attached to the frame via the open front end 221. Before the primary cover 226 is attached to the frame 230, an adhesive such as a two part epoxy is deposited on the bottom surface of the primary cover 226. When the primary cover 226 is attached to the frame, the adhesive spreads out over the primary bonding surface 239 to form a bondline between the primary cover 226 and the connector 225 and the frame 230. The adhesive, when dried, acts as the primary mechanism by which the primary cover 226 is held in place.

The strength of the adhesive bond is maximum at a specific bondline thickness range. To provide a bondline of consistent thickness and maximum strength, adhesive thickness control bumps 241 are formed in the primary bonding surface 239. The adhesive thickness control bumps 241 are of a predefined height and prevent the cover from contacting the primary bonding surface 239 regardless of the clamping force applied to the cover 226 and frame 230 during the assembly and adhesive cure process. The height of the adhesive thickness control bumps 241 determines the bondline thickness.

To assist in controlling the bondline thickness, the retaining rim 243 runs along the outer edge of primary bonding surface 239. The retaining rim 243 is of equal height to the adhesive thickness control bumps 241 and prevents the flow of adhesive towards the outer edges of the frame 230. In this manner, when the cover 226 is affixed to the frame 230, adhesive is displaced towards the center of the frame 230, and the bondline thickness for IC cards remains relatively constant regardless of clamping force applied. The adhesive thickness control bumps 241 and the retaining rim 243 thus combine to provide an even bondline thickness across the entire primary bonding surface 239. This results in increased mechanical strength of the IC card. The adhesive thickness control bumps 241 and the retaining rim 243 for the secondary side of frame 230 act equivalently.

The shapes of the adhesive thickness control bumps 241 are not limited to the rectangular shape shown in FIGS. 3A and 3B; however, if the frame is manufactured of injection molded plastic, the shape of the adhesive thickness control bumps 241 should be chosen to be amenable to formation by the injection molding process. Generally, the adhesive thickness control bumps 241 should be sized as small as possible such that a maximum bonding surface area is provided. The adhesive thickness control bumps 241 are spaced from one another to allow the flow of excess adhesive to the center of the IC card and to better ensure adequate support of the cover to prevent distortion of the cover.

Figure 4A:
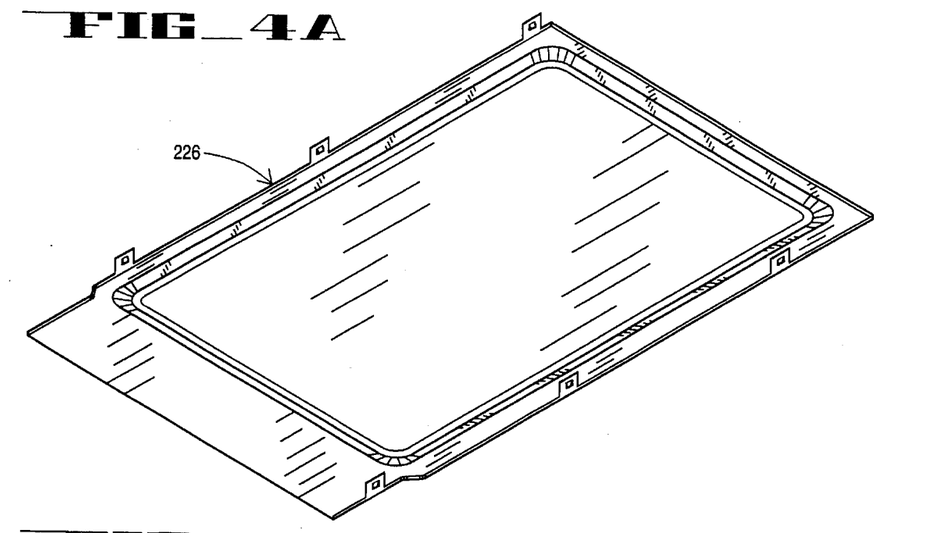
FIG. 4A is an isometric view of the cover.
Figures 4B, 4C:
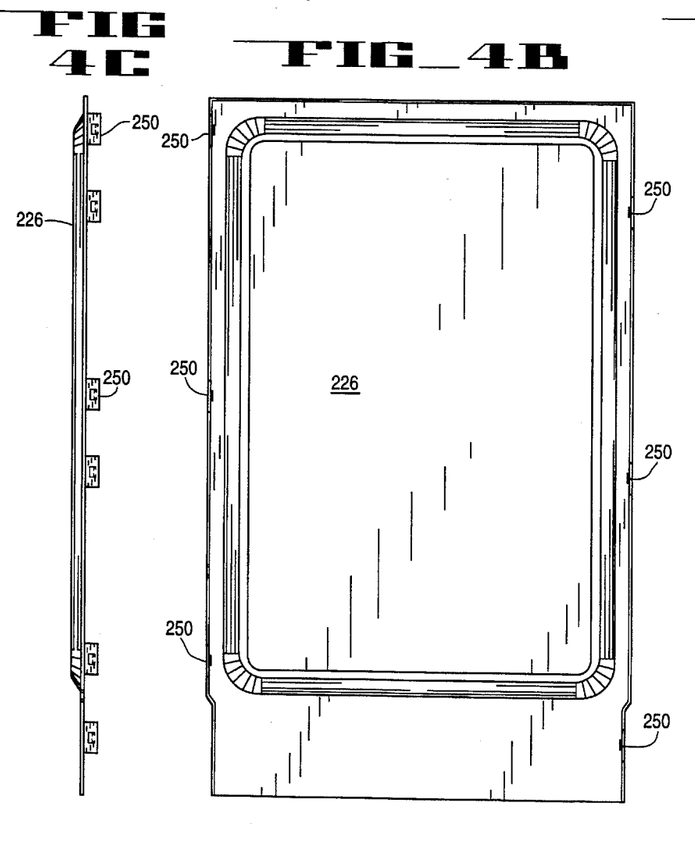
FIG. 4B shows the bottom of the cover.
FIG. 4C shows a first side of the cover.
Figure 4D:
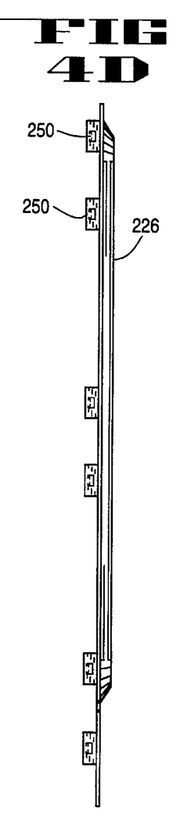
FIG. 4D shows a second side of the cover.

FIGS. 4A is an isometric view of a cover 226. Extending from the bottom surface of the cover 226 are feet 250. For this embodiment, each side of the cover 226 has three feet 250. Each set of three feet are asymmetrically placed relative to the other set such that the sets are staggered. The asymmetrical placement of the feet 250 is more clearly shown in FIG. 4B. FIGS. 4C and 4D are side views of the primary cover 226 in which all six feet 250 are visible. Primary and secondary covers 226 are identical and manufactured of stainless steel or a similarly rigid material. The placement of the feet allows the use of a single cover design for both the primary and secondary covers because when the bottom surfaces of the primary and secondary covers oppose one another, the feet of the primary cover do not come in contact with the feet of the secondary cover. The slots 245 of the frame are located in such a manner to provide for the staggering of the feet 250 of both covers 226.

As shown in FIG. 4A, latch tabs are formed in each of the feet 250. When the feet 250 of a cover 226 are inserted into the slots 245 of the frame 230, the latch tabs of the feet 250 lock the cover 226 into place. Thus, the latch tabs and the slots comprise the cover-to-frame lock structure mentioned above.

Figure 5A:
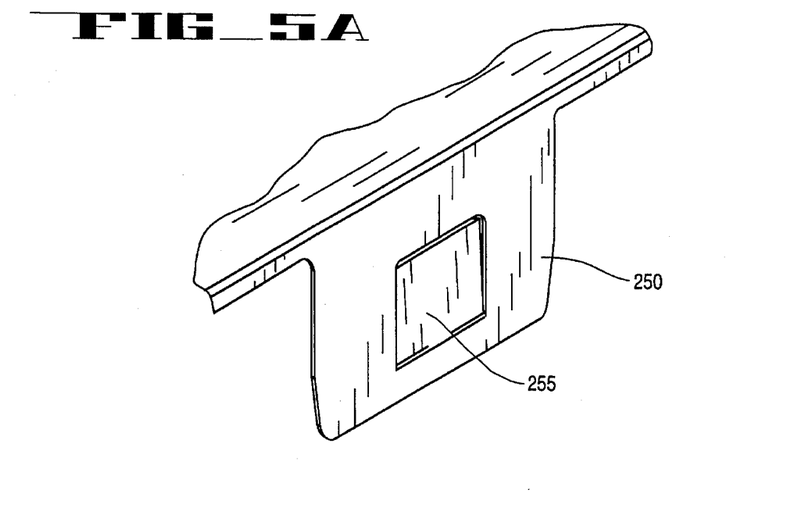
FIG. 5A is an isometric view of a foot the cover.
Figure 5B:
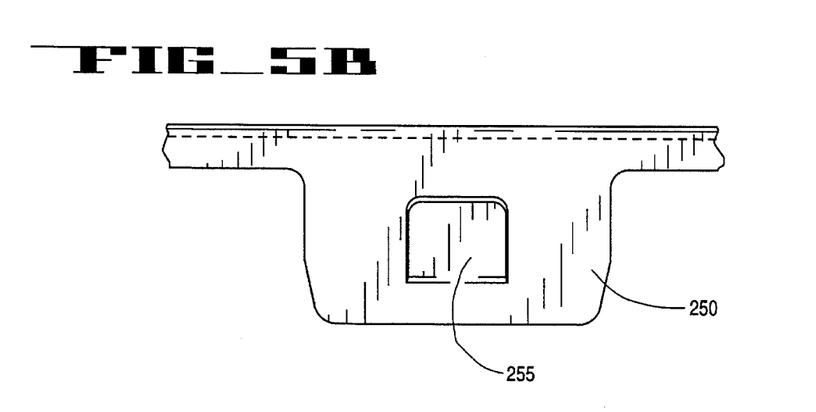
FIG. 5B is a front view of a foot the cover.
Figure 5C:
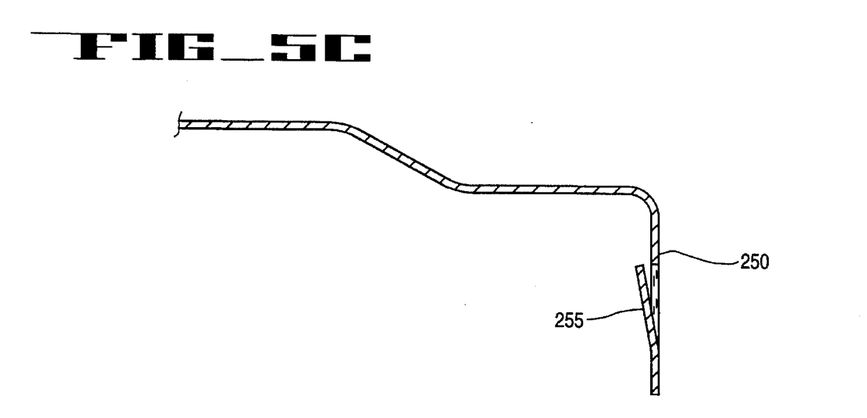
FIG. 5C is a side view of a foot the cover showing the inward flexing of the latch tab.

FIGS. 5A is an isometric view of a single foot 250. A latch tab 255 is formed in the foot 250. The latch tab 255 is formed by cutting the solid material of the foot 250 on three sides and flexing the cut out material of the foot inward towards the center of the cover 226. FIG. 5B is a front view of the foot 250. FIG. 5C is a side view of the foot 250 showing the inward flexing of the latch tab 255. The latch tabs 255 are bent inwards by an additional amount which compensates for the poor memory of stainless steel such that the latch tabs 255 flex back to the desired position after the feet 250 are inserted in the slots 245.

Figure 6A:
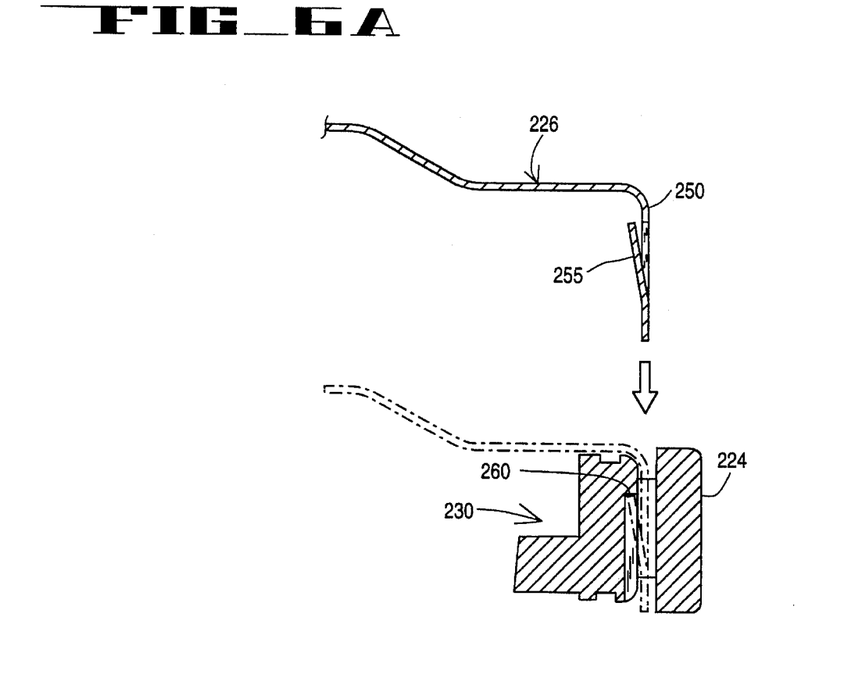
FIG. 6A is a cross-sectional view of a slot in the frame showing the latching of a foot of the primary cover.
Figure 6B:
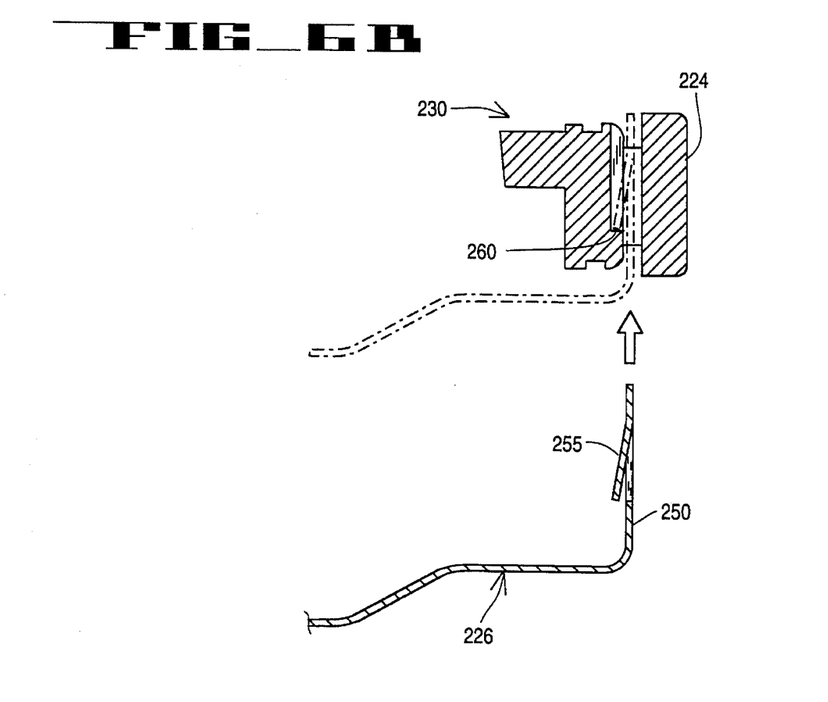
FIG. 6B is a cross-sectional view of a slot in the frame showing the latching of a foot of the secondary cover.

FIG. 6A and 6B show a cross-sectional view of a slot 245. FIG. 6A shows a slot for receiving the primary cover 226. The slot 245 is shown as going through the frame 230. Each of the slots 245 formed in the frame 230 are provided with a lip 260 for catching the latch tab 255 of a foot 250 after the foot 250 is inserted in the slot 245. To latch the latch tab 255 with the lip 260, the foot 250 of the cover 226 is inserted into the slot and pressure is applied to force the latch tab 255 through the slot 245. When the primary edge of the latch tab 255 clears the lip 260, the latch tab flexes inwardly towards the center of the frame 230. Attempts to remove the cover 226 from the frame 230 result in the top edge of the latch tab being forced into the lip 260. This results in greater mechanical strength for the IC card. FIG. 6B is a slot for receiving the secondary cover 227 and operates similarly.

The slot and latch tab structure provides a secondary mechanism for holding the frame 230 and covers 226 together. Once latched, the covers cannot be easily removed from the frame 230. Should the adhesive fail, the slot and latch tab structure securely fasten the covers 226 to the frame 230.

FIG. 7 shows the connector of the IC card. The connector 225 includes a connector tab 280 at each end. Prior to affixing the covers 226 to the frame 230, connector tabs 280 are locked into respective connector notches 247 of the frame 230. This locking mechanism provides an advantage over prior interconnects between frame 230 and connector 225. For example, prior frames do not lock the connector 225 into place. The connector 225 and printed circuit board assembly can therefore fall out during assembly of the IC card. Further, the connectors of prior IC cards are free to move, which can result in erroneous failures during electrical testing and damage to the card and test fixture during mechanical testing. Having the connector 225 locked into place as in the present embodiment results in improved rigidity for the frame and cover structure of the IC card. FIG. 8 shows the connector 225 locked into the frame 230.

In the foregoing specification the invention has been described with reference to specific exemplary embodiments thereof. It will, however, be evident that various modifications and changes may be made thereto without departing from the broader spirit and scope of the invention as set forth in the appended claims. The specification and the drawings are, accordingly, to be regarded in an illustrative rather than restrictive sense.

What is claimed is:

1. An apparatus for receiving and holding a printed circuit board comprising:

a cover having a bottom surface upon which an adhesive is deposited; and a frame coupled to the cover for receiving the printed circuit board, the frame having a bonding surface that includes a plurality of adhesive thickness control bumps, each of the plurality of adhesive thickness control bumps being of a predefined height for limiting a bondline thickness of the adhesive when the bottom surface of the cover is bonded to the frame.

2. The apparatus of claim 1, wherein the cover further includes a plurality of feet extending from the bottom surface of the cover, and the frame further includes a plurality of slots for receiving the plurality of feet.

3. The apparatus of claim 2, wherein each of the plurality of slots includes a lip and each of the plurality of feet has a latch tab formed therein.

4. The apparatus of claim 3, wherein placing the feet in the slots causes the latch tabs to catch the lips of the slots such that the cover is locked to the frame.

5. The apparatus of claim 1, wherein the frame further includes a retaining rim surrounding an outer perimeter of the bonding surface such that adhesive is forced towards a center of the frame when the cover is bonded to the frame.

6. The apparatus of claim 1, wherein the frame further includes an open end for receiving a connector, the open end including connector clasps for receiving connector tabs such that the connector is locked into place when the connector tabs are placed in the connector clasps.

7. An apparatus for receiving and holding a printed circuit board comprising:

a cover having a bottom surface upon which an adhesive is deposited; and a frame coupled to the cover, the frame having an open end that is defined on three sides by an extending portion of a first side of the frame, an extending portion of a second side of the frame, and a crossbar connected between the first and second sides, the frame further including:

an inner ledge for receiving the printed circuit board; and a bonding surface that includes a plurality of adhesive thickness control bumps, each of the plurality of adhesive thickness control bumps being of a predefined height for limiting a bondline thickness of the adhesive when the bottom surface of the cover is bonded to the frame.

8. The apparatus of claim 7, wherein the cover has a first side and a second side, the cover including a first plurality of feet extending from the first side of the cover and a second plurality of feet extending from the second side of the cover, the first and second pluralities of feet being asymmetrically placed relative to one another.

9. The apparatus of claim 8, wherein the frame further includes a first plurality of slots in the first side of the frame for receiving the first plurality of feet and a second plurality of slots in the second side of the frame for receiving the second plurality of feet.

10. The apparatus of claim 9, wherein each of the feet has a latch tab formed therein and each of the slots includes a lip such that placing the feet in the slots causes the latch tabs to catch the lips, locking the cover to the frame.

11. The apparatus of claim 10, wherein the frame further includes a retaining rim surrounding an outer perimeter of the bonding surface such that adhesive is forced towards a center of the frame when the cover is bonded to the frame.

12. The apparatus of claim 11, wherein the extending portion of the first side of the frame includes a first connector clasp and the extending portion of the second side of the frame includes a second connector clasp, the first and second connector clasps for receiving connector tabs of a connector such that the connector is locked into the frame.

13. The apparatus of claim 7, wherein the frame further includes a retaining rim surrounding an outer perimeter of the bonding surface such that adhesive is forced towards a center of the frame when the cover is bonded to the frame.

14. The apparatus of claim 7, wherein the extending portion of the first side of the frame includes a first connector clasp and the extending portion of the second side of the frame includes a second connector clasp, the first and second connector clasps for receiving connector tabs of a connector such that the connector is locked into the frame.

15. An integrated circuit card comprising:

a cover having a bottom surface upon which an adhesive is deposited; and a frame coupled to the cover, the frame having a bonding surface that includes a plurality of adhesive thickness control bumps, each of the plurality of adhesive thickness control bumps being of a predefined height for limiting a bondline thickness of the adhesive when the bottom surface of the cover is bonded to the frame.

16. The integrated circuit card of claim 15, wherein the cover further includes a plurality of feet extending from the bottom surface of the cover, and the frame further includes a plurality of slots for receiving the plurality of feet.

17. The integrated circuit card of claim 16, wherein each of the plurality of slots includes a lip and each of the plurality of feet has a latch tab formed therein.

18. The integrated circuit card of claim 17, wherein placing the feet in the slots causes the latch tabs to catch the lips of the slots such that the cover is locked to the frame.

19. The integrated circuit card of claim 15, wherein the frame further includes a retaining rim surrounding an outer perimeter of the bonding surface such that adhesive is forced towards a center of the frame when the cover is bonded to the frame.

20. The integrated circuit card of claim 15, wherein the frame further includes an open end for receiving a connector, the open end including connector clasps for receiving connector tabs such that the connector is locked into place when the connector tabs are placed in the connector clasps.

21. The integrated circuit card of claim 15, wherein the integrated circuit card operates according to a specification of a Personal Computer Card International Association (PCMCIA).

22. An integrated circuit card comprising:

a cover having a bottom surface upon which an adhesive is deposited; and a frame coupled to the cover, the frame having an open end that is defined on three sides by an extending portion of a first side of the frame, an extending portion of a second side of the frame, and a crossbar connected between the first and second sides, the frame further including:

a bonding surface that includes a plurality of adhesive thickness control bumps, each of the plurality of adhesive thickness control bumps being of a predefined height for limiting a bondline thickness of the adhesive when the bottom surface of the cover is bonded to the frame.

23. The integrated circuit card of claim 22, wherein the cover has a first side and a second side, the cover including a first plurality of feet extending from the first side of the cover and a second plurality of feet extending from the second side of the cover, the first and second pluralities of feet being asymmetrically placed relative to one another.

24. The integrated circuit card of claim 23, wherein the frame further includes a first plurality of slots in the first side of the frame for receiving the first plurality of feet and a second plurality of slots in the second side of the frame for receiving the second plurality of feet.

25. The integrated circuit card of claim 24, wherein each of the feet has a latch tab formed therein and each of the slots includes a lip such that placing the feet in the slots causes the latch tabs to catch the lips, locking the cover to the frame.

26. The integrated circuit card of claim 25, wherein the frame further includes a retaining rim surrounding an outer perimeter of the bonding surface such that adhesive is forced towards a center of the frame when the cover is bonded to the frame.

27. The integrated circuit card of claim 26, wherein the extending portion of the first side of the frame includes a first connector clasp and the extending portion of the second side of the frame includes a second connector clasp, the first and second connector clasps for receiving connector tabs of a connector such that the connector is locked into the frame.

28. The integrated circuit card of claim 22, wherein the frame further includes a retaining rim surrounding an outer perimeter of the bonding surface such that adhesive is forced towards a center of the frame when the cover is bonded to the frame.

29. The integrated circuit card of claim 22, wherein the extending portion of the first side of the frame includes a first connector clasp and the extending portion of the second side of the frame includes a second connector clasp, the first and second connector clasps for receiving connector tabs of a connector such that the connector is locked into the frame.

30. The integrated circuit card of claim 15, wherein the integrated circuit card operates according to a specification of a Personal Computer Card International Association (PCMCIA).

31. A portable computer system comprising:

a bus;

a processor coupled to the bus; and an integrated circuit card coupled to the bus, the integrated circuit card comprising:

a cover having a bottom surface upon which an adhesive is deposited; and a frame coupled to the cover, the frame having a bonding surface that includes a plurality of adhesive thickness control bumps, each of the plurality of adhesive thickness control bumps being of a predefined height for limiting a bondline thickness of the adhesive when the bottom surface of the cover is bonded to the frame.

32. The portable computer system of claim 31, wherein the cover further includes a plurality of feet extending from the bottom surface of the cover, and the frame further includes a plurality of slots for receiving the plurality of feet.

33. The portable computer system of claim 32, wherein each of the plurality of slots includes a lip and each of the plurality of feet has a latch tab formed therein.

34. The portable computer system of claim 33, wherein placing the feet in the slots causes the latch tabs to catch the lips of the slots such that the cover is locked to the frame.

35. The portable computer system of claim 31, wherein the frame further includes a retaining rim surrounding an outer perimeter of the bonding surface such that adhesive is forced towards a center of the frame when the cover is bonded to the frame.

36. The portable computer system of claim 31, wherein the frame further includes an open end for receiving a connector, the open end including connector clasps for receiving connector tabs such that the connector is locked into place when the connector tabs are placed in the connector clasps.

* * * * *